(12) United States Patent
Machida

(10) Patent No.: US 8,062,571 B2
(45) Date of Patent: Nov. 22, 2011

(54) RESIN SEALING METHOD IN STACKED WIRING SUBSTRATE

(75) Inventor: Yoshihiro Machida, Nagano (JP)

(73) Assignee: Shinko Electric Industries Co.. Ltd., Nagano-shi (JP)

( * ) Notice: Subject to any disclaimer, the term of this patent is extended or adjusted under 35 U.S.C. 154(b) by 0 days.

(21) Appl. No.: 12/573,293

(22) Filed: Oct. 5, 2009

(65) Prior Publication Data

US 2010/0090369 A1    Apr. 15, 2010

(30) Foreign Application Priority Data

Oct. 14, 2008    (JP) .................................. 2008-265235

(51) Int. Cl.
*B29C 45/02*    (2006.01)
*B29C 45/14*    (2006.01)

(52) U.S. Cl. ......... 264/272.14; 264/272.15; 264/272.17; 264/275

(58) Field of Classification Search ........................ None
See application file for complete search history.

(56) References Cited

U.S. PATENT DOCUMENTS

| | | | |
|---|---|---|---|
| 5,569,625 A * | 10/1996 | Yoneda et al. | 29/827 |
| 5,674,343 A * | 10/1997 | Hotta et al. | 156/245 |
| 5,708,300 A * | 1/1998 | Woosley et al. | 257/730 |
| 5,891,384 A | 4/1999 | Miyajima | |
| 6,258,314 B1 * | 7/2001 | Oida et al. | 264/511 |
| 6,369,449 B2 * | 4/2002 | Farquhar et al. | 257/778 |
| 6,717,279 B2 * | 4/2004 | Koike | 257/787 |
| 6,759,737 B2 * | 7/2004 | Seo et al. | 257/686 |
| 7,147,447 B1 * | 12/2006 | Takahashi | 425/89 |
| 7,624,501 B2 * | 12/2009 | Machida | 29/846 |
| 2002/0025352 A1 * | 2/2002 | Miyajima | 425/89 |
| 2004/0245674 A1 * | 12/2004 | Yew et al. | 264/272.17 |
| 2009/0008765 A1 | 1/2009 | Yamano | |

FOREIGN PATENT DOCUMENTS

JP    8-142106    6/1996
WO    WO 2007/069606 A1    6/2007

* cited by examiner

*Primary Examiner* — Edmund H. Lee
(74) *Attorney, Agent, or Firm* — Kratz. Quintos & Hanson. LLP

(57) ABSTRACT

A resin sealing device includes a lower die, an upper die which is arranged over the lower die, on a lower surface side of which a concave portion is provided, and to a bottom surface peripheral portion of the concave portion of which a projection portion projecting toward an opening portion side of the concave portion to raise partially a bottom surface is provided, and a protection film provided on a lower surface side of the upper die and adhered along a concave surface of the concave portion by adsorbing, wherein the stacked wiring substrate is sealed with a resin by making a fused resin flow into a cavity including a space between the stacked wiring substrate from a resin supplying portion, in a state that the stacked wiring substrate in which a plurality of wiring substrates are stacked via connection bumps is arranged and sandwiched between the lower die and the concave portion of the upper die.

6 Claims, 7 Drawing Sheets

(partialy plan view)

RESIN SEALING METHOD IN STACKED WIRING SUBSTRATE

CROSS-REFERENCE TO RELATED APPLICATIONS

This application is based on and claims priority of Japanese Patent Application No. 2008-265235 filed on Oct. 14, 2008, the entire contents of which are incorporated herein by reference.

BACKGROUND OF THE INVENTION

1. Field of the Invention

The present invention relates to a resin sealing method in a stacked wiring substrate for sealing a resin between wiring substrates stacked via connection bumps and a resin sealing device.

2. Description of the Related Art

In the prior art, there are various semiconductor devices of a resin sealing type. In Patent Literature 1 (Patent Application Publication (KOKAI) Hei-8-142106), it is set forth that, in a device for molding one surface of a semiconductor chip mounted on a substrate with a resin, an adsorbing means for adsorbing/supporting a substrate by means of an air suction is provided to one of an upper die and a lower die, and the adsorbing/supporting means for adsorbing/supporting a release film for making the pealing easy is provided to the other of the upper die and the lower die.

Also, in Patent Literature 2 (WO 2007/069606 A1), it is set forth that a second wiring substrate is stacked/connected onto a first wiring substrate on which a semiconductor chip is mounted via solder balls, then a resultant structure is placed between upper and lower dies, and then a mold resin is filled between the first and second wiring substrates from an opening portion of the dies.

As explained in the column of related art described later, when the resin is filled between the wiring substrates stacked via the connection bumps by the transfer molding method using the mold dies, the connection failure between the wiring substrates is caused in some cases because the upper wiring substrate is pushed up by the inflow of the resin.

SUMMARY OF THE INVENTION

It is an object of the present invention to provide a resin sealing method of a stacked wiring substrate, capable of filling a resin between wiring substrates which are stacked via connection bumps, not to cause the failure with good reliability, and a resin sealing device.

The present invention is concerned with a resin sealing method in a stacked wiring substrate, which includes the steps of preparing a resin sealing device and a stacked wiring substrate, the resin sealing device including a lower die, an upper die which is arranged over the lower die, on a lower surface side of which a concave portion is provided, and to a bottom surface peripheral portion of the concave portion of which a projection portion projecting toward an opening portion side of the concave portion to raise partially a bottom surface is provided, and a protection film provided on a lower surface side of the upper die and adhered along a concave surface of the concave portion by adsorbing, and the stacked wiring substrate constructed by stacking a plurality of wiring substrates via connection bump; and sealing the stacked wiring substrate with a resin by making a fused resin flow into a cavity including a space between the stacked wiring substrate from a resin supplying portion, in a state that the stacked wiring substrate is arranged and sandwiched between the lower die and the concave portion of the upper die.

In the resin sealing method of the present invention, the stacked wiring substrate is arranged and sandwiched between the lower die and the concave portion of the upper die, and the fused resin is filled in the cavity including a space of the stacked wiring substrate. The projection portion for projecting toward the opening portion side of the concave portion to raise partially the bottom surface is provided to the bottom surface peripheral portion of the concave portion of the upper die. The protection film is adsorbed along the concave surface of the concave portion on the lower surface side of the upper die.

There is such a tendency that the protection film which is adsorbed is sucked strongly at the bottom surface peripheral portion of the concave portion, and a thickness of that portion is ready to thin. Therefore, a clearance is produced on the peripheral portion of the uppermost wiring substrate of the stacked wiring substrate. As a result, the wiring substrate is warped upward by a pushing up force when making the resin flow in, and thus the connection failure is easily caused between the stacked wiring substrates.

In the present invention, the projection portion is provided to the bottom surface peripheral portion of the concave portion of the upper die, where the protection film which is adsorbed is easily reduced in thickness, thereby the bottom-raising is done at the part of the upper die. Therefore, a depression of the protection film in the bottom surface peripheral portion of the concave portion of the upper die can be prevented. As a result, the overall upper surface of the uppermost wiring substrate of the stacked wiring substrate contacts the protection film and then are held by the lower die and the upper die, and therefore the uppermost wiring substrate can withstand the pushing up force applied from the resin which flows in.

Accordingly, when the resin is filled into the space between the stacked wiring substrates, the generation of the connection failure between the stacked wiring substrates can be prevented.

In the preferred mode of the present invention, a height of the projection portion provided to the bottom surface peripheral portion in the concave portion of the upper die, is set such that a lower surface of the protection film is kept at a same height in a bottom surface center portion and a bottom surface peripheral portion of the concave portion of the upper die, when the protection film is adsorbed on a lower surface of the upper die.

Also, the semiconductor chip may be mounted on the lower wiring substrate of the stacked wiring substrate, and the resin may be filled between the semiconductor chip and the upper wiring substrate.

As explained above, in the present invention, the resin can be filled in the space of the wiring substrates stacked via the connection bumps with good reliability not to cause any failure.

DETAILED DESCRIPTION OF THE PREFERRED EMBODIMENTS

Embodiments of the present invention will be explained with reference to the accompanying drawings hereinafter.

Figure 1:
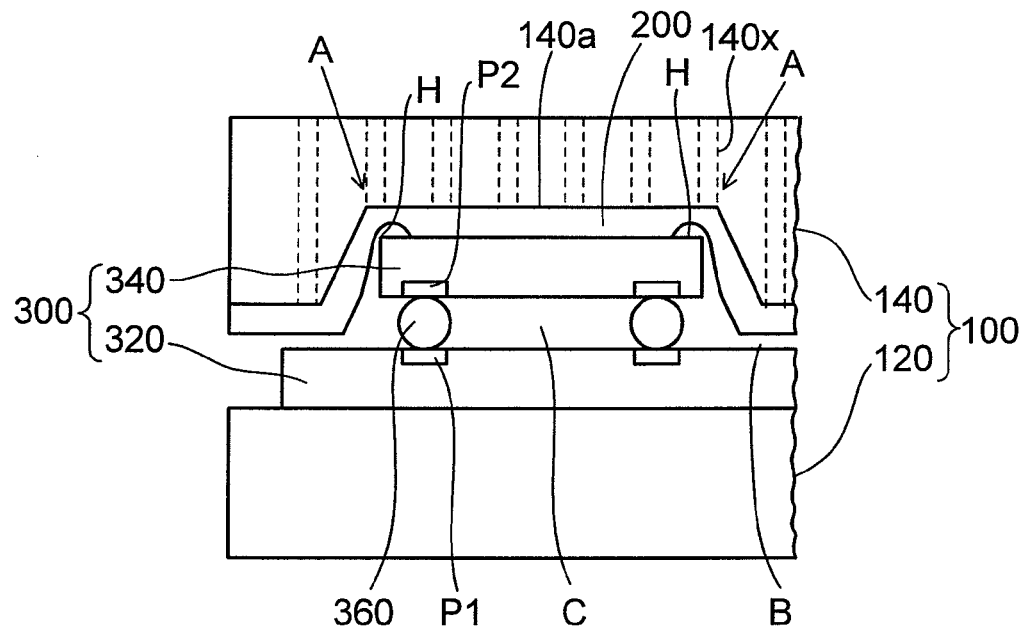
FIG. 1 is a sectional view (#1) showing a resin sealing method in a stacked wiring substrate in the related art associated with the present invention.
Figure 2:
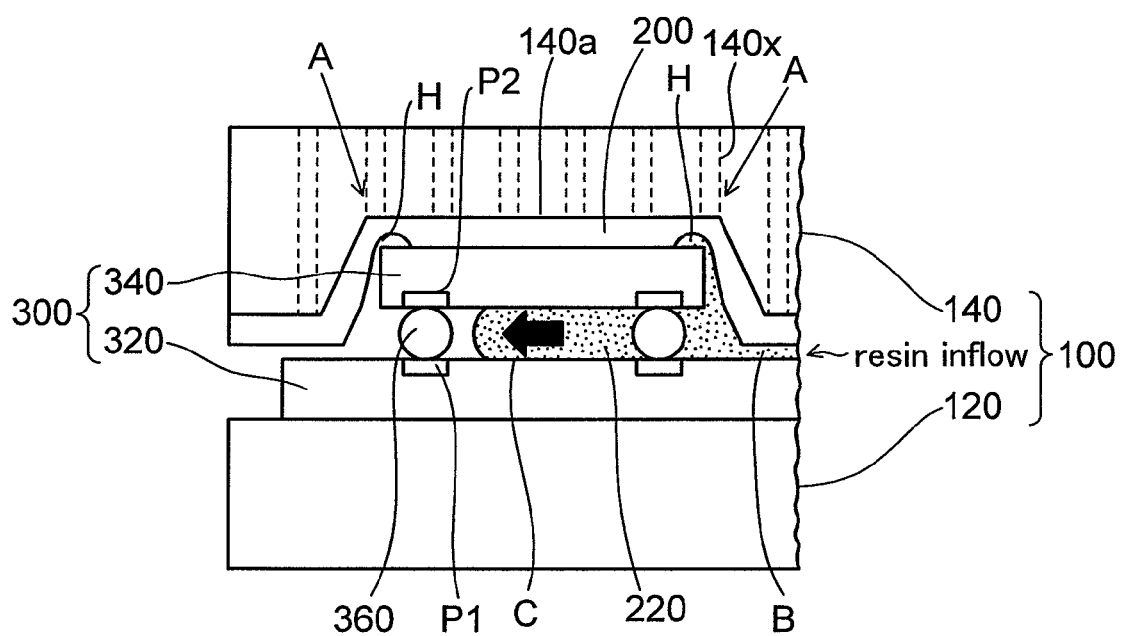
FIG. 2 is a sectional view (#2) showing the resin sealing method in the stacked wiring substrate in the related art associated with the present invention.

Prior to the explanation of a resin sealing method in a stacked wiring substrate according to an embodiment of the present invention, the problem of the related art associated with the present invention will be explained hereunder. FIG. 1 and FIG. 2 are sectional views showing a resin sealing method in a stacked wiring substrate in the related art.

In the resin sealing method in the related art, as shown in FIG. 1, first, a mold die 100 constructed by a lower die 120 and an upper die 140 is prepared. A concave portion 140a for constituting a cavity into which a resin is filled is provided to lower surface side of the upper die 140. Also, a protection film 200 is provided on a lower surface of the upper die 140 along a concave surface of the concave portion 140a. The protection film 200 is provided so as to prevent adhesion of a resin to the upper die 140 when a resin flows into the cavity.

Then, a stacked wiring substrate 300 in which a second wiring substrate 340 is stacked on a first wiring substrate 320 via solder bumps 360 is arranged between the lower die 120 and the concave portion 140a of the upper die 140. In the stacked wiring substrate 300, connection pads P1 on the upper surface side of the first wiring substrate 320 are connected electrically to connection pads P2 on the lower surface side of the second wiring substrate 340 via the solder bumps 360.

The stacked wiring substrate 300 is sandwiched between the lower die 120 and the upper die 140, thereby a cavity C that a resin flows in is constructed by the upper die 140 (the protection film 200), the second wiring substrate 340, and the first wiring substrate 320. A clearance is provided between the lower surface of the protection film 200 in lateral vicinity of the cavity C and the upper surface of the first wiring substrate 320. This clearance acts as a resin supplying portion B (mold gate) connected to the cavity C.

A large number of suction ports 140x used to suck/adsorb the protection film 200 are provided to the upper die 140. Air is sucked from the suction ports 140x by a vacuum pump, thereby the protection film 200 is sucked along the concave surface of the concave portion 140a of the upper die 140. The protection film 200 is formed of Teflon (registered trademark) whose elasticity is weak, or the like.

At this time, because a bottom surface periphery portion A of the concave portion 140a of the upper die 140 corresponds to the portion where a bottom surface and a side surface of the concave portion 140a intersects with each other, the protection film 200 is easily sucked into suction ports 140x side locally. Therefore, only these parts of the protection film 200 arranged in the bottom surface periphery portion A of the concave portion 140a of the upper die 140 are reduced in thickness locally. As a result, on the peripheral portion of the second wiring substrate 340 on the upper side of the stacked wiring substrate 300, the protection film 200 does not tightly contact the second wiring substrate 340, so that a clearance H produces in this portion.

Then, as shown in FIG. 2, a fused resin is made to flow into the cavity C side from the resin supplying portion B, and thus a resin 220 is filled in the cavity C.

Figure 3:
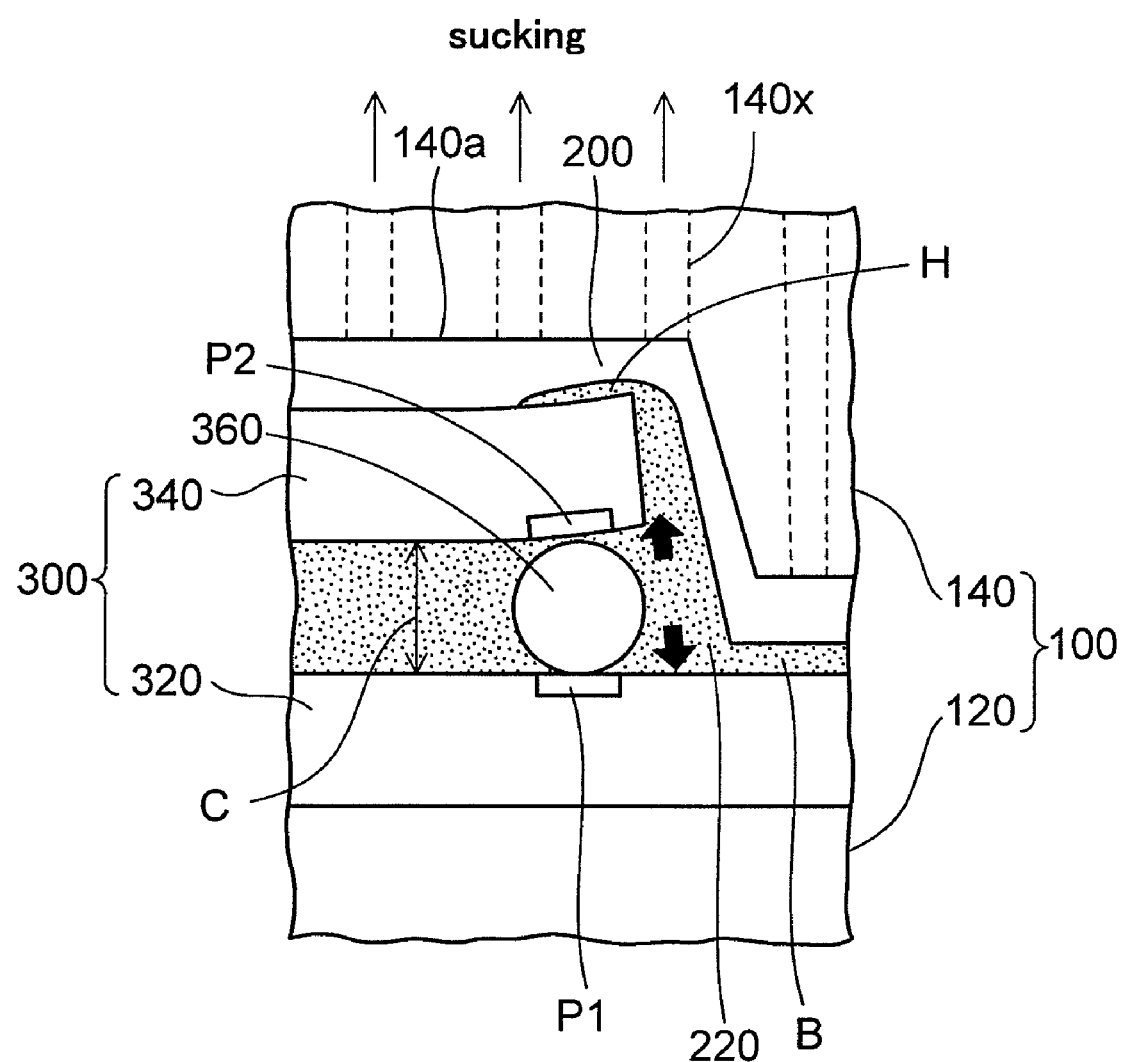
FIG. 3 is a sectional view explaining a problem of the resin sealing method in the stacked wiring substrate in the related art associated with the present invention.

At this time, by reference to a fragmental enlarged view in FIG. 3 together, the clearance H produces on the peripheral portion of the second wiring substrate 340 on the upper side of the stacked wiring substrate 300. Therefore, a holding force of the mold die 100 is weakened on that portion. That is, a space in which the second wiring substrate 340 is pushed to the upper side produces on the peripheral portion of the second wiring substrate 340.

Accordingly, particularly in the case that the stacked wiring substrate 300 is formed of the thin substrate, when the fused resin 220 flows into the cavity C, the second wiring substrate 340 cannot withstand an pushing up force produced by the inflow of the resin 220. Thus, the end portion of the second wiring substrate 340 bends upward.

As a result, the bonding failure of the solder bumps 360 occurs readily at the end portion of the resin supplying portion B side of the second wiring substrate 340, so that the connection failure may be caused in some cases between the first wiring substrate 320 and the second wiring substrate 340. The edge portion of one side of the square second wiring substrate 340 on the resin supplying portion B side is explained as above. Also, it is possible that the similar connection failure may be caused on the edge portions of other sides.

The resin sealing method in the stacked wiring substrate of an embodiment of the present invention explained hereunder can solve the above-mentioned failure.

Embodiment

Figure 4:
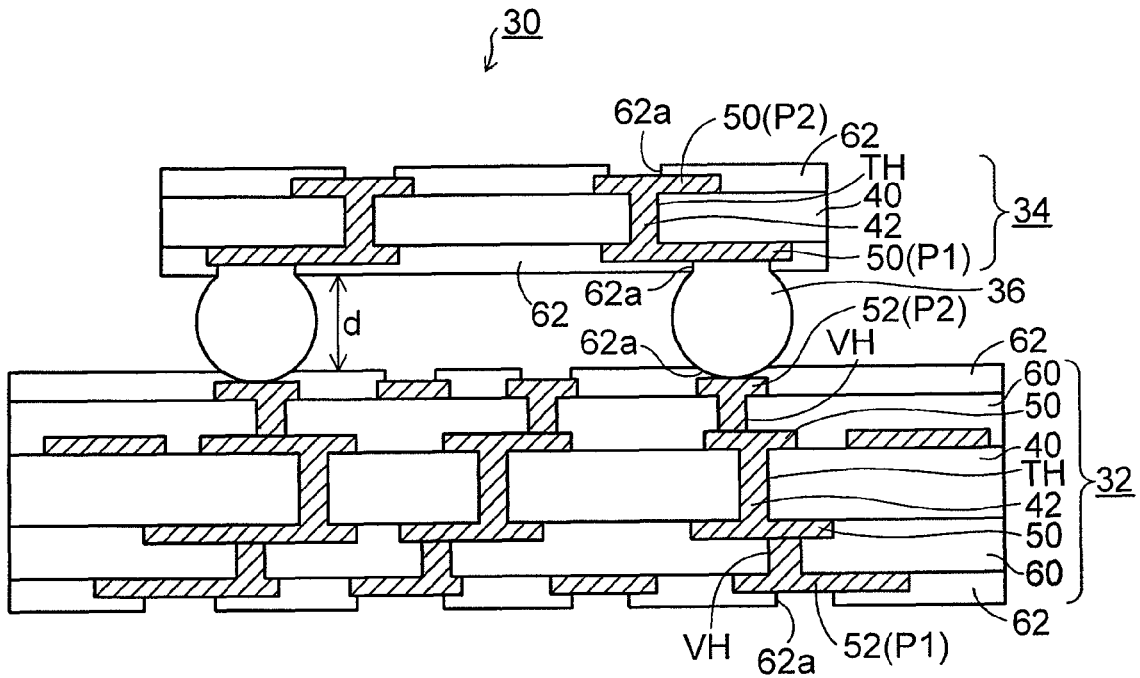
FIG. 4 is a sectional view (#1) showing a stacked wiring substrate used in a resin sealing method in a stacked wiring substrate according to an embodiment of the present invention.
Figure 5:
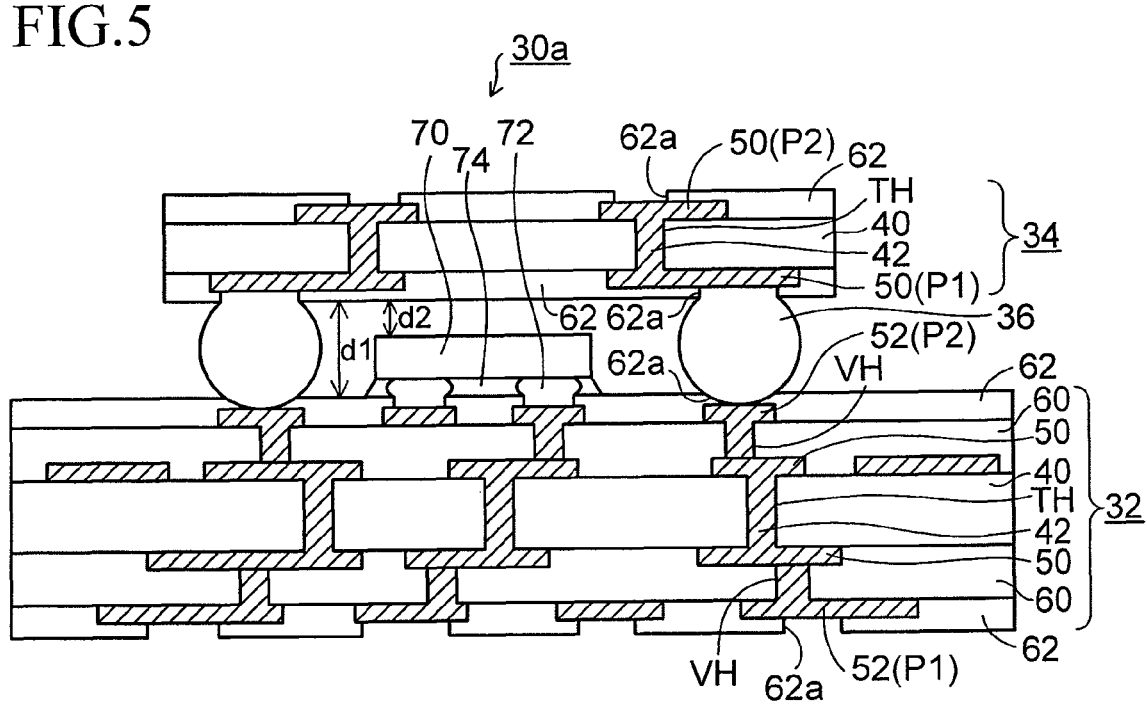
FIG. 5 is a sectional view (#2) showing a stacked wiring substrate used in the resin sealing method in the stacked wiring substrate according to the embodiment of the present invention.

At first, the stacked wiring substrate used in the present embodiment will be explained hereunder. FIG. 4 and FIG. 5 are sectional views showing a stacked wiring substrate used in a resin sealing method in a stacked wiring substrate according to an embodiment of the present invention.

As shown in FIG. 4, a stacked wiring substrate 30 used in the present embodiment is constructed by stacking a second wiring substrate 34 on a first wiring substrate 32 via solder bumps 36.

In the first wiring substrate 32, an insulating core substrate 40 formed of a glass epoxy resin, or the like is arranged in a center portion in the thickness direction, and through holes TH are provided in the core substrate 40. First wiring layers 50 connected mutually via a through electrode filled in the through hole TH is formed on both surface sides of the core substrate 40 respectively.

Otherwise, the first wiring layers 50 on both surface sides may be connected mutually via a through hole plating layer (through electrode) provided on an inner wall of the through hole TH respectively in the core substrate 40, and then the remained holes of the through holes TH may be filled with a resin.

An interlayer insulating layer 60 for covering the first wiring layers 50 is formed on both surface sides of the core substrate 40 respectively. The interlayer insulating layer 60 is made of an insulating resin such as epoxy resin, polyimide resin, or the like, and is formed by pasting a resin film, or the like. Also, via holes VH each reaching the first wiring layer 50 are provided in the interlayer insulating layer 60 on both surface sides of the core substrate 40 respectively.

Second wiring layers 52 each connected to the first wiring layer 50 via the via hole VH (via conductor) are formed on the interlayer insulating layer 60 on both surface sides of the core substrate 40 respectively. In both surface sides of the core substrate 40, the connection pads P1, P2 are shown as the second wiring layer 52 respectively.

Also, a solder resist 62 in which an opening portion 62a is provided on the connection pads P1, P2 is formed on both surface sides of the core substrate 40 respectively. A contact portion (not shown) formed by a nickel layer/a gold plating layer in order from the bottom is provided on surfaces of the connection pads P1, P2 on both surface sides of the core substrate 40 respectively.

Also, in the second wiring substrate 34, the through holes TH are provided in the core substrate 40. The first wiring layers 50 connected mutually via the through electrode 42 filled in the through hole TH are provided on both surface sides of the core substrate 40 respectively. In both surface sides of the core substrate 40, the connection pads P1, P2 are shown as the wiring layer 50 respectively.

The solder resist 62 in which the opening portion 62a is provided on the connection pads P1, P2 is formed on both surface sides of the core substrate 40 respectively. The contact portion (not shown) formed by the nickel layer/the gold plating layer in order from the bottom is provided on the surfaces of the connection pads P1, P2 on both surface sides of the core substrate 40 respectively.

The solder bumps 36 are arranged between the connection pads P2 on the upper surface side of the first wiring substrate 32 and the connection pads P1 on the lower surface side of the second wiring substrate 34. The first wiring substrate 32 and the second wiring substrate 34 are connected mutually by the solder bumps 36.

The second wiring substrate 34 is arranged on the first wiring substrate 32 via the solder balls and then the reflow-heating is applied, thereby the first wiring substrate 32 and the second wiring substrate 34 are connected electrically by the solder bumps 36. The solder bumps 36 are illustrated as the connection bumps (connection terminals) that are used to connect the stacked wiring substrate 30. In this case, various conductive bumps such as gold bumps, and the like can be employed.

A gap d corresponding to a height of the solder bumps 36 is provided between the first wiring substrate 32 and the second wiring substrate 34. A resin is filled in the gap d by a resin sealing device of the present embodiment described later. Respective thicknesses of the first and second wiring substrates 32, 34 are made thin, and each thickness is set to 100 to 300 for example. Also, a height of the solder bump 36 (the gap d between the first and second wiring substrates 32, 34) is set to 150 μm, for example.

In this case, in the first and second wiring substrates 32, 34, the number of lamination of the wiring layers formed on both surface sides of the core substrate 40 can be set arbitrarily. Also, the coreless wiring substrate that does not have the core substrate 40 may be employed.

Also, an example in which two wiring substrates 32, 34 are stacked is illustrated in FIG. 4. But the number of lamination of the wiring substrates (an integer of 2 or more) can be set arbitrarily. The resin is filled collectively in respective gaps between a plurality of wiring substrates by the resin sealing device of the present embodiment.

In FIG. 5, a stacked wiring substrate 30a in which a semiconductor chip is built is shown. Connection bumps 72 of a semiconductor chip 70 are flip-chip connected to the connection pads P2 in the center portion of the upper surface of the first wiring substrate 32 in FIG. 4 mentioned above. Also, an underfill resin 74 is filled between the semiconductor chip 70 and the first wiring substrate 32.

Also, like FIG. 4, the connection pads P2 on the upper surface of the first wiring substrate 32 on the peripheral side and the connection pads P1 on the lower surface of the second wiring substrate 34 on the peripheral side are connected mutually via the solder bumps 36. The height of the solder bump 36 is set higher than the thickness of the semiconductor chip 70, and the semiconductor chip 70 is housed in housing portion under the second wiring substrate 34. Then, the resin is filled into gaps d1, d2 between the first wiring substrate 32 and the semiconductor chip 70, and the second wiring substrate 34 by the resin sealing device of the present embodiment.

In FIG. 5, the number of lamination of the wiring substrates (an integer of 2 or more) can also be set arbitrarily, and the semiconductor chip can be mounted on any wiring substrate. In addition to the semiconductor chip, a passive element such as a capacitor, or the like may be mounted. Other elements in FIG. 5 are same as those in FIG. 4, and therefore their explanation will be omitted by affixing the same reference symbols to them.

Figure 6:
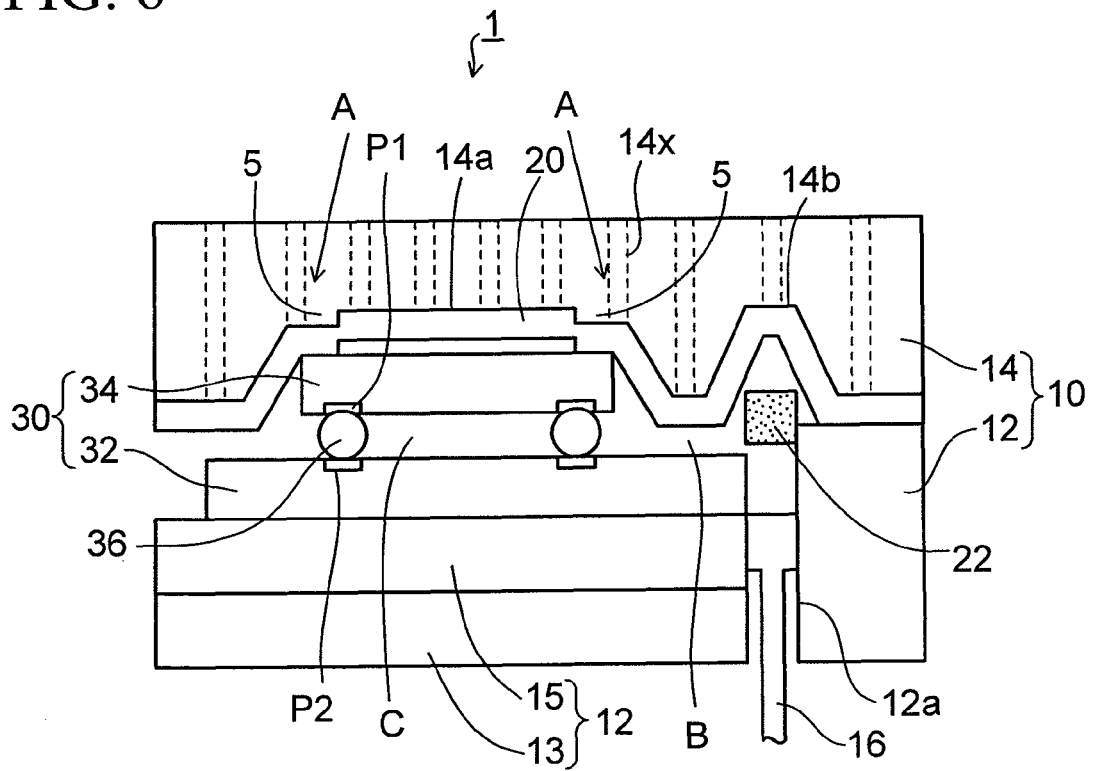
FIG. 6 is a sectional view and a plan view (#1) showing a resin sealing method in a stacked wiring substrate according to the embodiment of the present invention.
Figure 6:
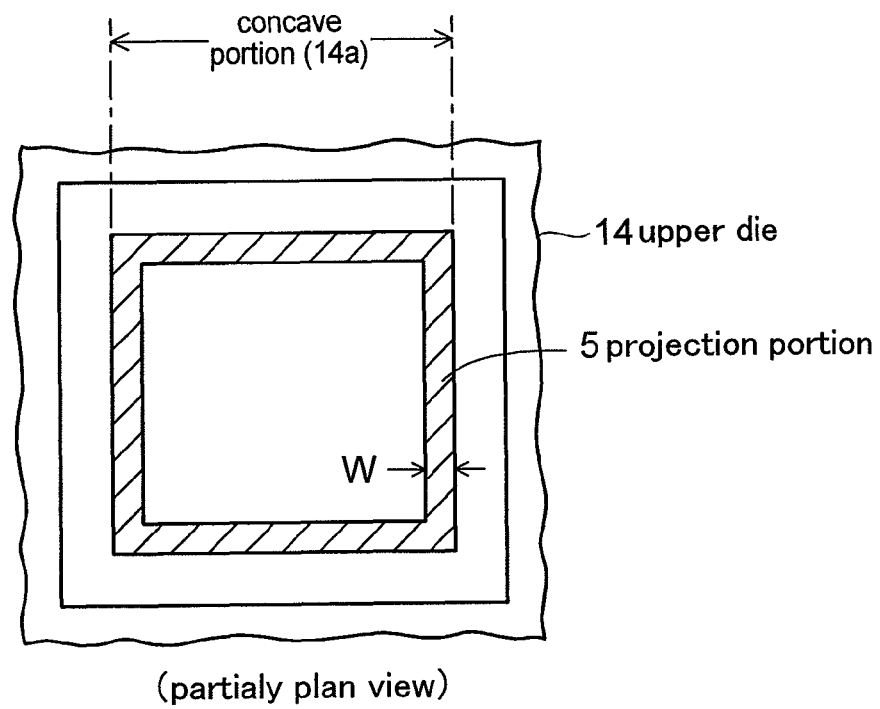
Figure 7:
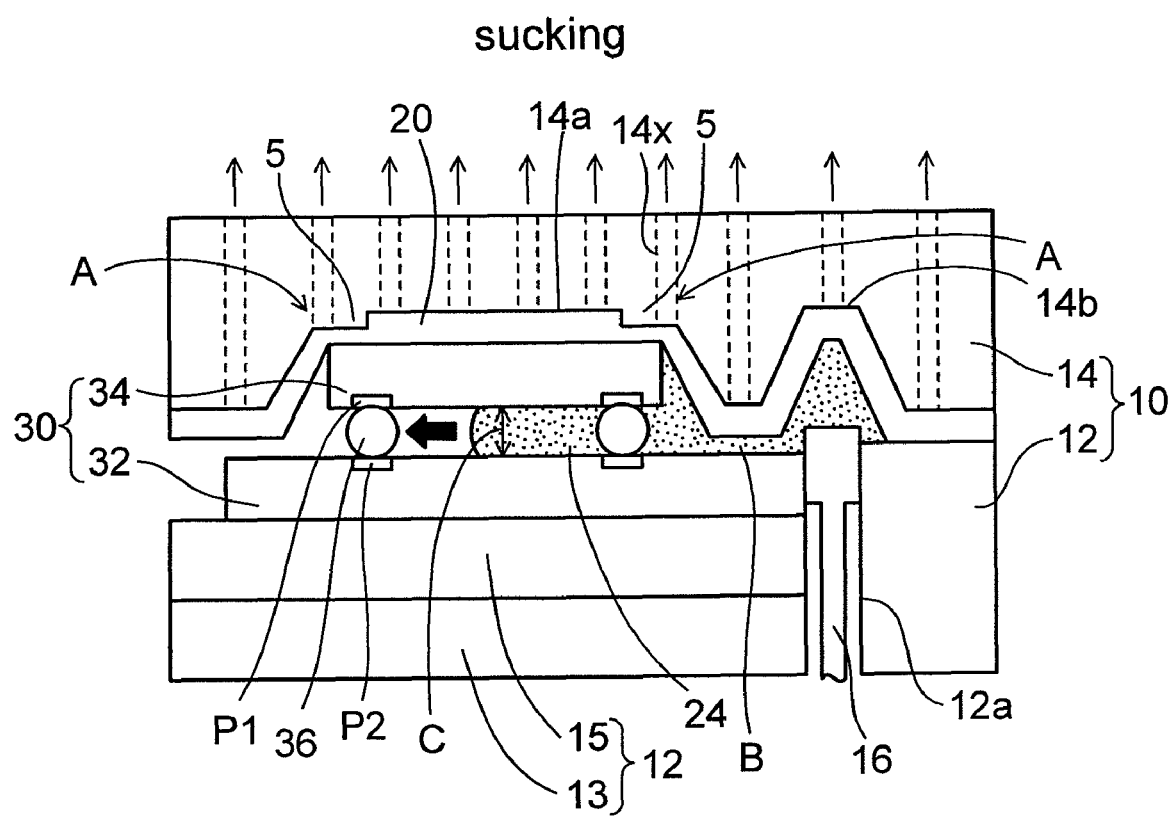
FIG. 7 is a sectional view (#2) showing the resin sealing method in the stacked wiring substrate according to the embodiment of the present invention.
Figure 8:
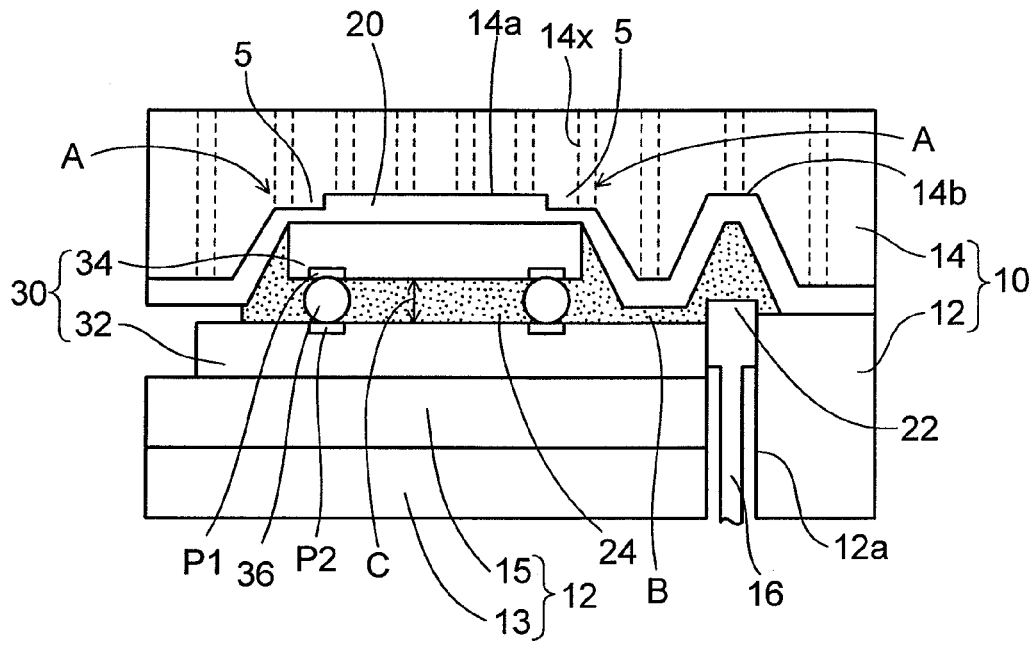
FIG. 8 is a sectional view (#3) showing the resin sealing method in the stacked wiring substrate according to the embodiment of the present invention.

Next, a resin sealing method in a stacked wiring substrate according to the present embodiment will be explained hereunder. FIG. 6 to FIG. 8 are sectional views showing a resin sealing method in a stacked wiring substrate according to the embodiment of the present invention.

First, a resin sealing device 1 employed in the present embodiment will be explained hereunder. As shown in FIG. 6, the resin sealing device 1 of the present embodiment has a mold die 10 that is constructed basically by a lower die 12 and an upper die 14. The mold die 10 is the metal die employed in the transfer molding method.

An opening portion 12a is provided on one end side of the lower die 12, and a plunger (pressure rod) 16 that moves vertically is provided in the opening portion 12a. Also, a portion of the lower die 12 where a work is arranged is constructed by arranging a removable stage member 15 on a supporting table 13. By exchanging to the stage member 15 whose thickness is different, the gap between the lower die 12 and the upper die 14 can be adjusted to correspond to a thickness of the work.

A concave portion 14a for constituting the cavity C that the resin is made to flow in is provided in a center main portion of the lower surface side of the upper die 14. Also, a concave shaped pot 14b is provided in vicinity of the concave portion 14a of the upper die 14.

Also, a protection film 20 is provided on the lower surface side of the upper die 14 along concave surfaces of the concave portion 14a and the pot 14b. A resin tablet 22 is inserted into the pot 14b. As the material of the resin tablet 22, a thermosetting resin such as epoxy resin, or the like is employed.

Also, the stacked wiring substrate 30 described above as the work is arranged and sandwiched between the lower die 12 and the concave portion 14a (the protection film 20) of the upper die 14. In FIG. 6, the stacked wiring substrate 30 in FIG. 4 is depicted in a simplified manner. The concave portion 14a of the upper die 14 corresponds roughly to a size of the second wiring substrate 34 located on the upper side of the stacked wiring substrate 30, and the second wiring substrate 34 is housed in the concave portion 14a of the upper die 14.

The cavity C into which the resin is filled is constructed by the concave portion 14a (the protection film 20) of the upper die 14 and the stacked wiring substrate 30. The protection film 20 is provided so as to prevent such an event that the resin adheres to the upper die 14 when the resin is filled in the cavity C. As the protection film 20, Teflon (registered trademark) whose elasticity is weak, or the like is employed.

In the region between the concave portion 14a of the upper die 14 and the pot 14b, a clearance is provided between the upper surface of the lower die 12 and the lower surface of the protection film 20. This clearance acts as the resin supplying portion B (mold gate) connected to the cavity C. The resin fused in the pot 14b flows into the cavity C through the resin supplying portion B.

A large number of suction ports 14x are provided to the upper die 14. Air is sucked from the suction ports 14x by a vacuum pump, thereby the protection film 20 is adsorbed along the concave surfaces of the concave portion 14a and the pot 14b of the upper die 14.

A ring-shaped projection portion 5 that projects to the opening portion side (lower side in FIG. 6) of the concave portion 14a is provided partially on the bottom surface periphery portion A of the concave portion 14a of the upper die 14. That is, on the bottom surface of the concave portion 14a of the upper die 14, the surface of the peripheral portion is projected rather than the surface of the center portion to the opening portion side of the concave portion 14a and the bottom-rising is done.

By reference to a fragmental plan view in FIG. 6 together, in the bottom surface of the concave portion 14a of the upper die 14, the projection portion 5 (hatched portion) is formed and connected to the peripheral portion thereof with the ring shape.

In FIG. 6, in order to facilitate the explanation, a state before air is sucked from the suction ports 14x of the upper die 14 is virtually illustrated, and the protection film 20 is arranged along the surface of the concave portion 14a of the upper die 14, which has the projection portion 5, without change in thickness. In other words, before the protection film 20 is sucked/adsorbed, the surface of the protection film 20 arranged in the peripheral portion of the concave portion 14a is arranged to project from the surface of the protection film 20 arranged in the center portion of the concave portion 14a by a height of the projection portion 5.

In the above-mentioned related art (FIG. 3), such an event is explained that, when the protection film 200 is sucked onto the concave portion 140a of the upper die 140, the protection film 200 arranged in the bottom surface peripheral portion of the concave portion 140a of the upper die 140 is reduced in thickness rather than the protection film 200 arranged in the center portion.

In the present embodiment, in view of such event, a height of the projection portion 5 (an amount of the bottom-raising) is set to correspond to a difference in thickness between the protection film arranged in the bottom surface center portion of the concave portion 14a and the protection film arranged in the bottom surface peripheral portion thereof. Accordingly, a reduction in film thickness caused when the protection film 20 arranged in the bottom surface peripheral portion A of the concave portion 14a of the upper die 14 is sucked can be compensated by the projection portion 5.

Then, as shown in FIG. 7, air is sucked from the suction ports 14x of the upper die 14 by a vacuum pump in a state that the stacked wiring substrate 30 is sandwiched between the lower die 12 and the upper die 14. In the present embodiment, the projection portion 5 whose height corresponds to a reduction in thickness of the protection film 20 is provided to the bottom surface peripheral portion A of the concave portion 14a of the upper die 14, and thus the bottom-rising is done.

Therefore, even though the protection film 20 arranged in the bottom surface peripheral portion A of the concave portion 14a of the upper die 14 is thinned, the protection film 20 is kept at a substantially same height over the whole surface in the peripheral portion and the center portion of the concave portion 14a. Thus, the protection film 20 contacts the overall upper surface of the second wiring substrate 34.

For example, when an area of the second wiring substrate 34 located to the upper side is 64 mm×64 mm, a width of the projection portion 5 (W in the fragmental plan view of FIG. 6) provided to the peripheral portion of the concave portion 14a of the upper die 14 is set to about 5 mm. Also, a height of the projection portion 5 (an amount of the bottom-raising) is adjusted by the material or the thickness such that the overall lower surface of the protection film 20 can be set at the same height in the bottom surface of the concave portion 14a of the upper die 14. For example, when a Teflon (registered trademark) sheet of 50 to 100 μm thickness is employed as the protection film 20, a height of the projection portion 5 (an amount of the bottom-raising) is adjusted within a range of 5 to 10 μm.

In this manner, the stacked wiring substrate 30 is sandwiched between the lower die 12 and the upper die 14, thereby the cavity C that the resin flows in is constructed in an area between the stacked wiring substrate 30 and side areas of the second wiring substrate 34.

In this state, a pressure is applied to the resin tablet 22 by moving the plunger 16 upwardly, and the resin tablet 22 is heated by the upper die equipped with a heating means and is fused at a temperature of 170 to 180° C. Since the resin tablet 22 is fused while applying a pressure by the plunger 16, it is possible to make a void in the resin disappear.

A resin 24 fused in the pot 14b flows into the cavity C side through the resin supplying portion B. A pressure in the cavity C is reduced by a vacuum pump from the opposite side to the resin supplying portion B of the mold die 10. Accordingly, the fused resin 24 flows into the cavity C side smoothly.

In this manner, as shown in FIG. 8, the resin 24 is filled into the overall cavity C, and the resin sealing is completed. Then the lower die 12 and the upper die 14 are held until the resin 24 in the cavity C turns into a gel. Then, the upper die 14 and the lower die 12 are removed from the stacked wiring substrate 30, and the gate resin portion formed in the resin supplying portion B is broken off and separated from the filled resin 24.

Figure 9:
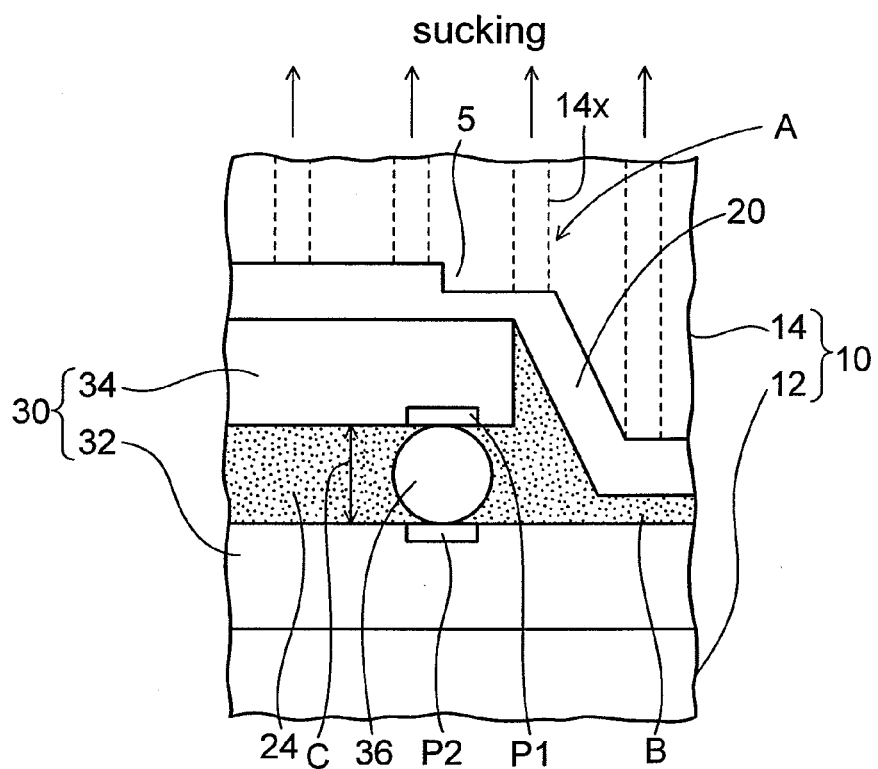
FIG. 9 is a sectional view (#4) showing the resin sealing method in the stacked wiring substrate according to the embodiment of the present invention.

By reference to a fragmental enlarged view of FIG. 9 together, in the present embodiment, the bottom surface is raised by providing the projection portion 5 in the bottom surface periphery portion A of the concave portion 14a of the upper die 14. Therefore, when the protection film 20 is sucked/adsorbed onto the concave portion 14a of the upper die 14, a reduction in film thickness of the protection film 20 can be compensated.

Accordingly, the protection film 20 contacts the overall upper surface of the second wiring substrate 34, and thus the whole second wiring substrate 34 can be held by the lower die 12 and the upper die 14. Therefore, unlike the above-mentioned related art, no clearance is produced on the peripheral portion of the second wiring substrate 34. As a result, even though a force for pushing the second wiring substrate 34 upwardly is applied by the resin which flows in, the second wiring substrate 34 can withstand such force, and it is no possibility that the warp of the substrate occurs.

Accordingly, such a situation can be prevented that the bonding between the first wiring substrate and the second wiring substrate 34, and the solder bumps 36 is broken down. Therefore, even though particularly thicknesses of the first and second wiring substrates 32, 34 are made thin to about 100 to 300 μm and a rigidity of the stacked wiring substrate 30 is weakened, such a situation can be prevented that, when the resin 24 is filled between the first and second wiring substrates 32, 34, the connection failure is caused between them, and thus manufacturing yield can be improved.

In the example in the above fragmental plan view of FIG. 6, the projection portion 5 is provided and connected to the bottom surface periphery portion A of the concave portion 14a of the upper die 14 with the ring shape. In this case, the projection portion 5 may be provided to the parts corresponding to the solder bumps 36 of the stacked wiring substrate 30, or the like, in the divided state, out of the bottom surface periphery portion A of the concave portion 14a of the upper die 14.

Figure 10:
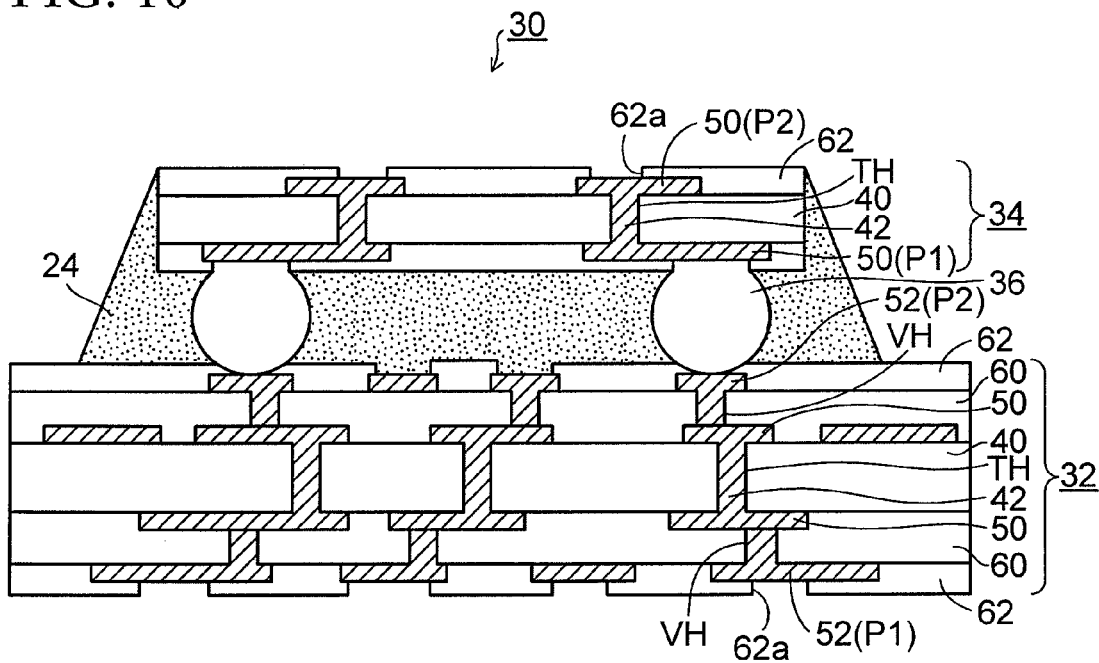
FIG. 10 is a sectional view showing a state that a resin is filled in a space between the stacked wiring substrates according to the embodiment of the present invention.

In FIG. 10, such a situation is depicted that the resin 24 is filled between the first and second wiring substrates 32, 34 of the stacked wiring substrate 30 in FIG. 4. In the stacked wiring substrate 30 in FIG. 10, the semiconductor chip is flip-chip connected to the connection pads P2 on the upper surface side of the second wiring substrate 34, and the connection terminals are provided on the connection pads P1 on the lower surface side of the first wiring substrate 32. Thus, the semiconductor device is constructed.

Figure 11:
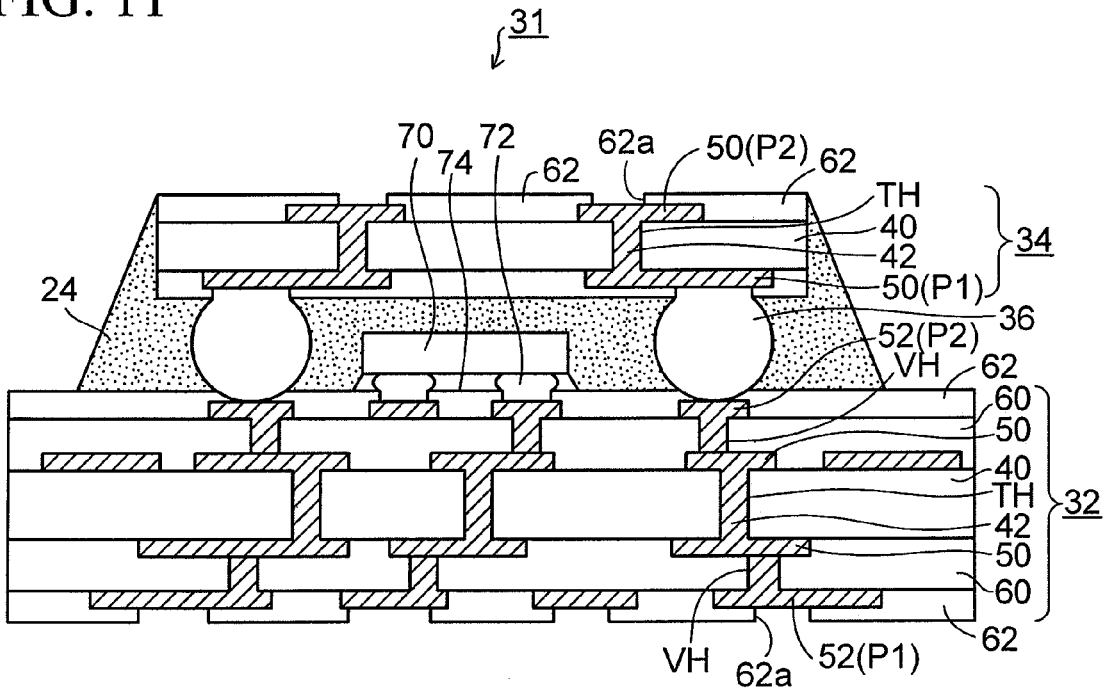
FIG. 11 is a sectional view showing a state that a resin is filled between the stacked wiring substrates in which a semiconductor chip is built, according to the embodiment of the present invention.

Also, in FIG. 11, a semiconductor device 31 constructed by filling the resin into the space between the stacked wiring substrate 30a in which the semiconductor chip 70 is built, in FIG. 5, is shown.

In the semiconductor device 31 in FIG. 11, the semiconductor chip 70 mounted on the first wiring substrate 32 is arranged in the housing portion under the second wiring substrate 34, and is embedded in the resin 24 that is filled between the first and second wiring substrates 32, 34. Then, the connection terminals are provided on the connection pads P1 on the lower surface side of the first wiring substrate 32. The semiconductor chip may be further mounted on the connection pads P2 on the upper surface side of the second wiring substrate 34.

As described above, in the resin sealing method of the present embodiment, the resin can be sealed between the stacked wiring substrates with good reliability. Therefore, the stacked wiring substrates and the semiconductor device having good reliability of the electric connection can be manufactured.

What is claimed is:

1. A resin sealing method in a stacked wiring substrate, comprising the steps of:
preparing a resin sealing device and a stacked wiring substrate,
the resin sealing device including
a lower die,
an upper die which is arranged over the lower die, on a lower surface side of which a concave portion having a bottom surface is provided, and to the bottom surface peripheral portion of the concave portion of which a projection portion projecting in relation to the remaining bottom surface toward an opening portion side of the concave portion to raise partially the bottom surface is provided, and
a protection film provided on a lower surface side of the upper die and adhered along a concave surface of the concave portion by adsorbing, and
the stacked wiring substrate constructed by stacking a plurality of wiring substrates via connection bump; and
sealing the stacked wiring substrate with a resin by making a fused resin flow into a cavity including space between the plurality of wiring substrates from a resin supplying portion, in a state that the stacked wiring substrate is arranged and sandwiched between the lower die and the concave portion of the upper die, with the partially raised projection portion of the concave portion being directly opposed to a peripheral portion of the uppermost wiring substrate and the protection film contacting the overall upper surface of the uppermost wiring substrate.

2. A resin sealing method in a stacked wiring substrate, according to claim 1, wherein a height of the projection portion is set such that, when the protection film is adsorbed on a lower surface of the upper die, a lower surface of the protection film is kept at a same height in a bottom surface center portion and a bottom surface peripheral portion of the concave portion of the upper die.

3. A resin sealing method in a stacked wiring substrate, according to claim 1, wherein the projection portion provided on the bottom surface peripheral portion of the concave portion of the upper die is formed and connected with a ring shape.

4. A resin sealing method in a stacked wiring substrate, according to claim 1, wherein the protection film is formed of Teflon (registered trademark).

5. A resin sealing method in a stacked wiring substrate, according to claim 1, wherein a semiconductor chip is mounted on the wiring substrate of a lower side in the stacked wiring substrate, and the resin is filled between the semiconductor chip and the wiring substrate of an upper side.

6. A resin sealing method in a stacked wiring substrate, according to claim 1, the protection film is adsorbed to the upper die by sucking.

* * * * *